(12) United States Patent
Liao et al.

(10) Patent No.: US 12,426,327 B2
(45) Date of Patent: Sep. 23, 2025

(54) SEMICONDUCTOR DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventors: Yi-Bo Liao, Hsinchu (TW); Lin-Yu Huang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 450 days.

(21) Appl. No.: 17/889,944

(22) Filed: Aug. 17, 2022

(65) Prior Publication Data

US 2024/0063266 A1  Feb. 22, 2024

(51) Int. Cl.
*H10D 62/13* (2025.01)
*H10D 84/01* (2025.01)
*H10D 84/03* (2025.01)
*H10D 84/83* (2025.01)

(52) U.S. Cl.
CPC ......... *H10D 62/151* (2025.01); *H10D 84/013* (2025.01); *H10D 84/038* (2025.01)

(58) Field of Classification Search
CPC ............ H10D 30/6219; H10D 64/258; H10D 84/0149; H10D 64/254; H10D 62/151; H10D 84/013; H10D 84/038; H10D 84/83; H01L 21/76897; H01L 23/5226; H01L 23/528; H01L 21/743; H01L 21/76898; H01L 23/48; H01L 23/481; H01L 23/485; H01L 21/76877–76883
See application file for complete search history.

(56) References Cited

U.S. PATENT DOCUMENTS 10,797,139 B2 * 10/2020 Morrow .............. H10D 30/024
2020/0273794 A1   8/2020 Khaderbad et al.
2021/0287994 A1 * 9/2021 Hsueh .............. H01L 21/76846
2021/0375756 A1  12/2021 Lee et al.

* cited by examiner

*Primary Examiner* — Sonya McCall-Shepard
(74) *Attorney, Agent, or Firm* — NZ Carr Law Office

(57) ABSTRACT

A semiconductor device structure, along with methods of forming such, are described. The structure includes a source/drain region and a first conductive feature disposed below the source/drain region. The first conductive feature is electrically connected to the source/drain region. The structure further includes a second conductive feature disposed over the source/drain region, and the second conductive feature is electrically connected to the source/drain region. The structure further includes a third conductive feature disposed on and in contact with a first portion of the second conductive feature and a dielectric layer disposed on and in contact with a second portion of the second conductive feature.

20 Claims, 16 Drawing Sheets

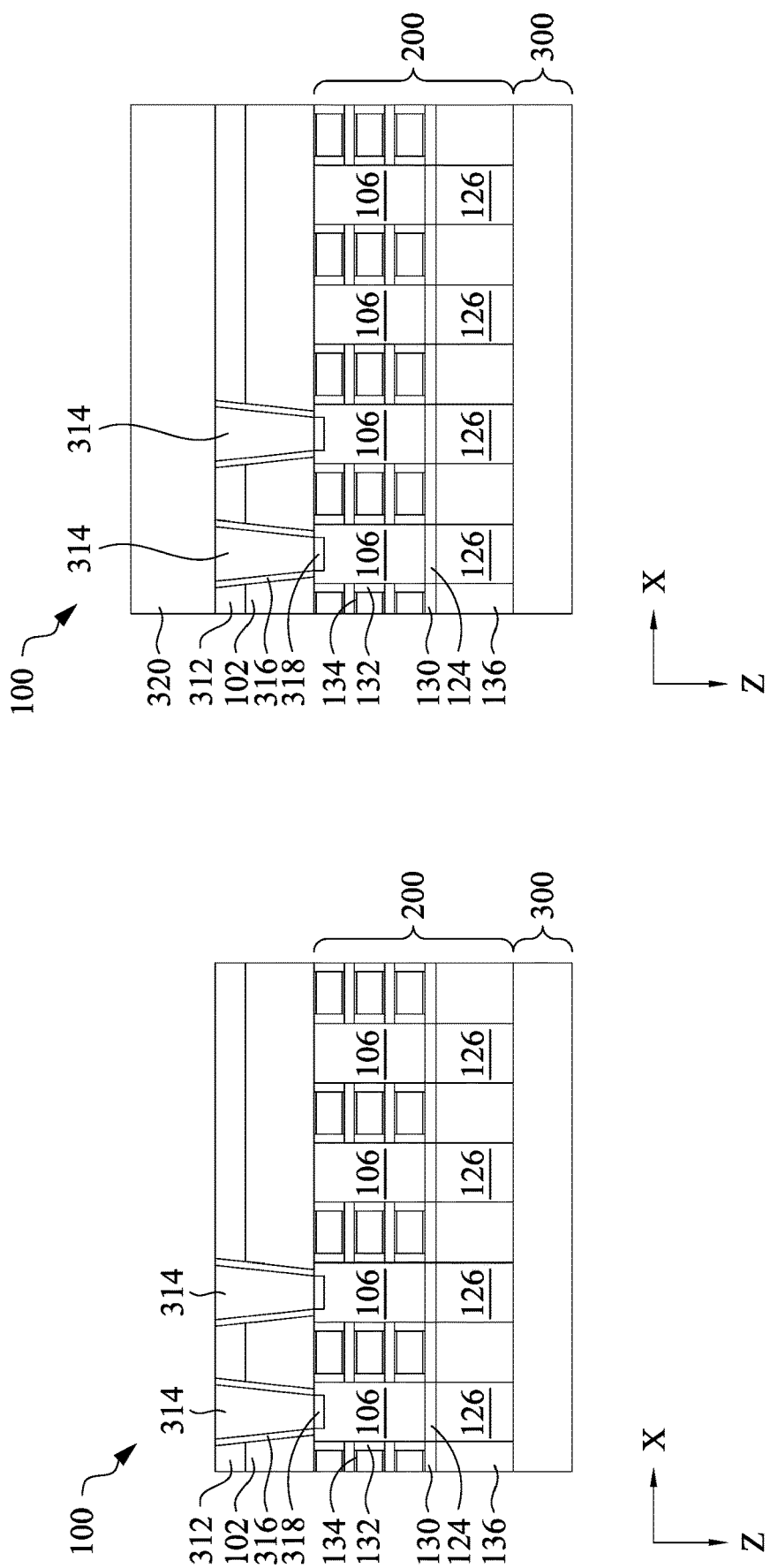

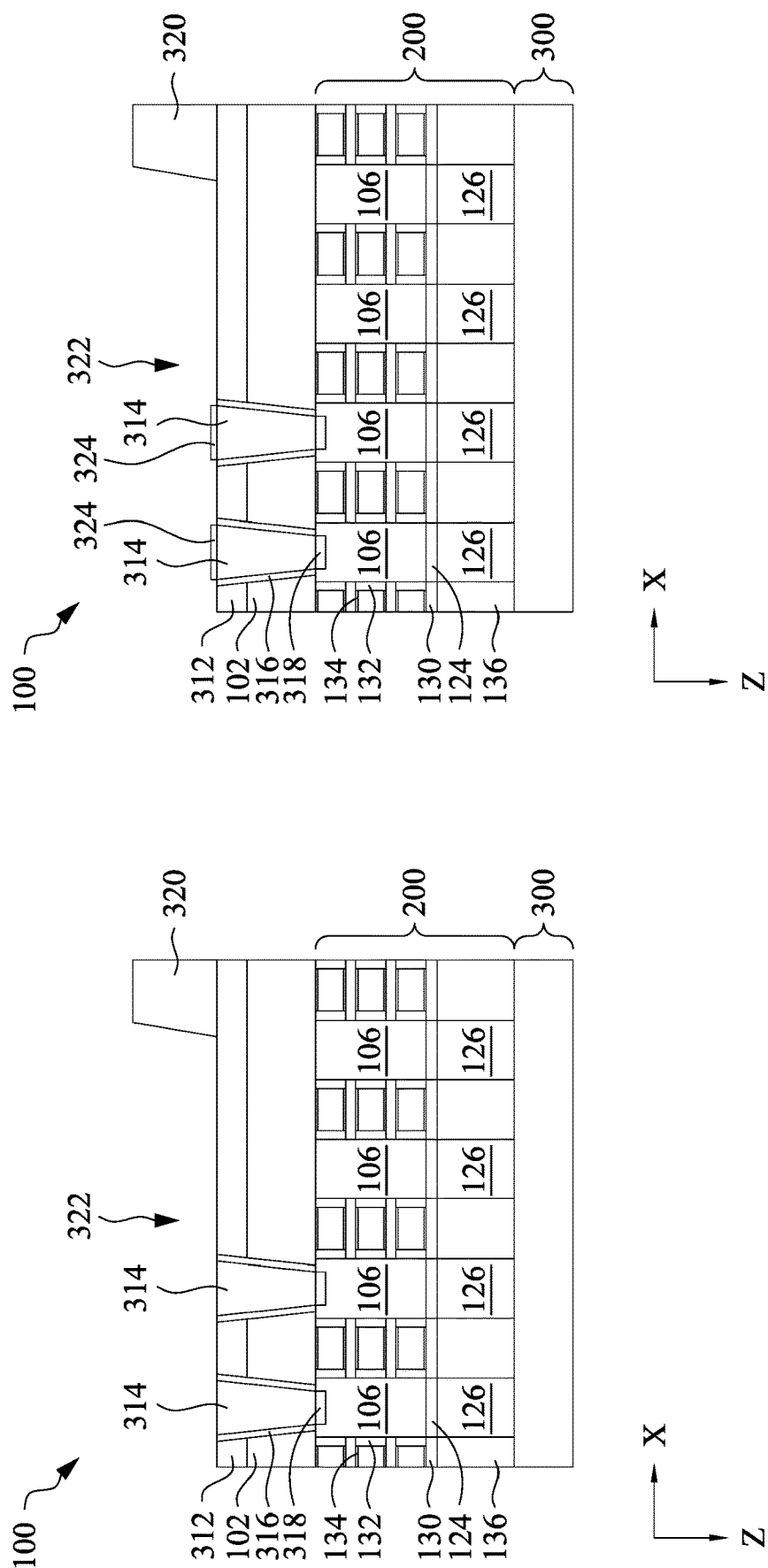

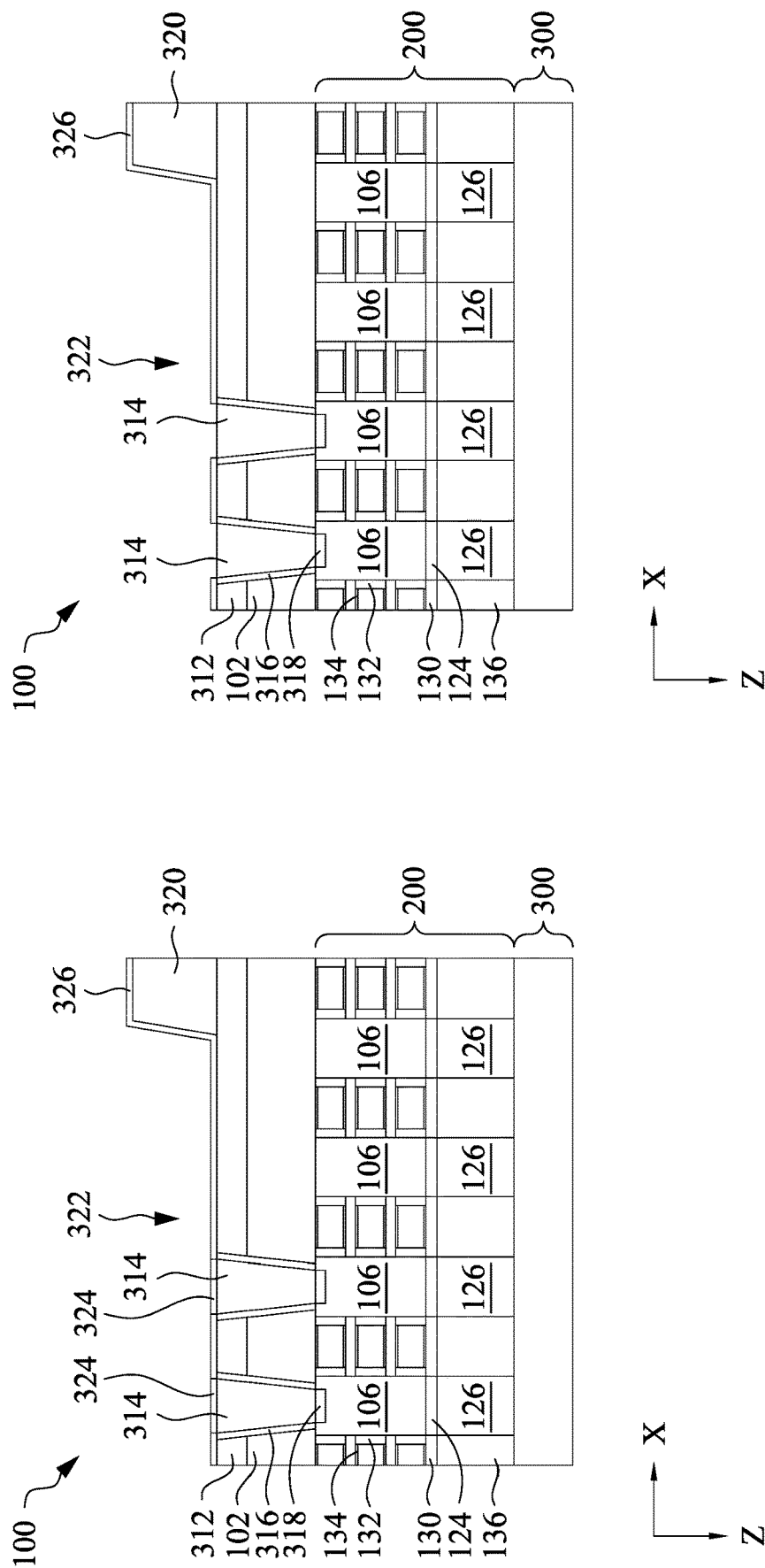

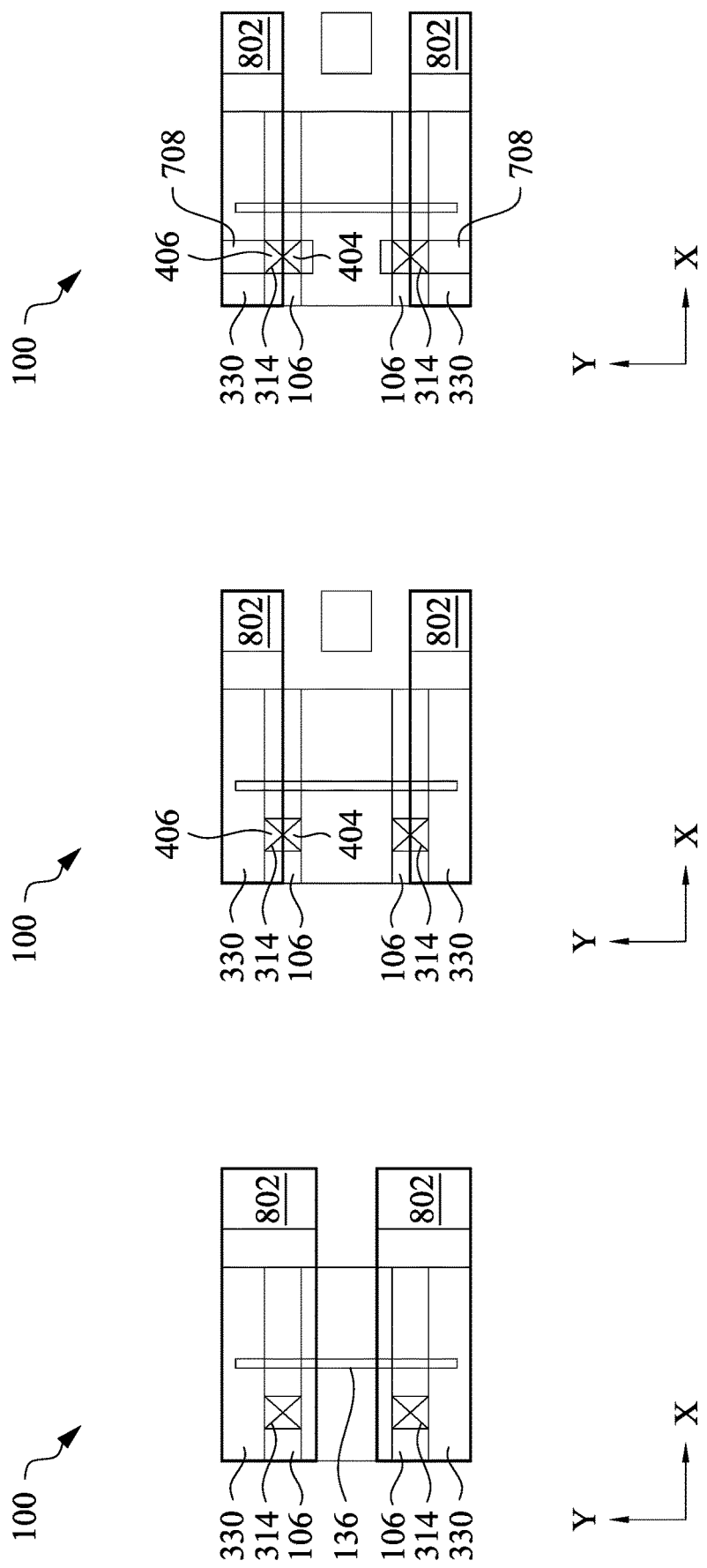

SEMICONDUCTOR DEVICE STRUCTURE AND METHODS OF FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Therefore, there is a need to improve processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3H are cross-sectional side views of various stages of manufacturing the semiconductor device structure, in accordance with some embodiments.

FIGS. 8A-8C are bottom views of the semiconductor device structure, in accordance with some embodiments.

DETAILED DESCRIPTION

Figure 1:
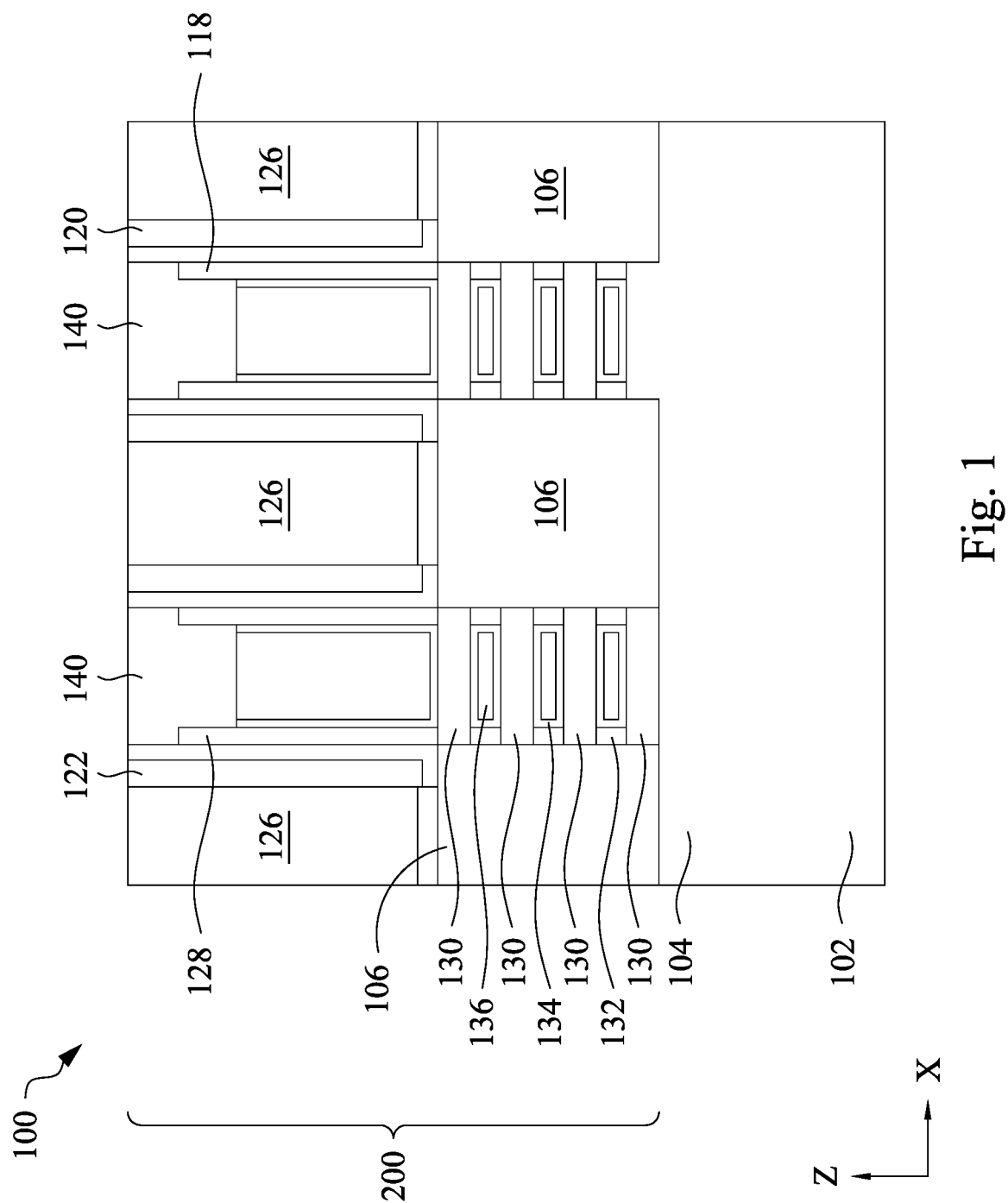
FIG. 1 is a cross-sectional side view of a stage of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a stage of manufacturing a semiconductor device structure 100. As shown in FIG. 1, the semiconductor device structure 100 includes a substrate 102 having substrate portions 104 extending therefrom and source/drain (S/D) regions 106 disposed over the substrate portions 104. The substrate 102 may be a semiconductor substrate, such as a bulk silicon substrate. In some embodiments, the substrate 102 may be an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; other suitable materials; or combinations thereof. Possible substrates 102 also include a silicon-on-insulator (SOI) substrate. SOI substrates are fabricated using separation by implantation of oxygen (SIMOX), wafer bonding, and/or other suitable methods. The substrate portions 104 may be formed by recessing portions of the substrate 102. Thus, the substrate portions 104 may include the same material as the substrate 102. The substrate 102 and the substrate portions 104 may include various regions that have been suitably doped with impurities (e.g., p-type or n-type impurities). The dopants are, for example boron for a p-type field effect transistor (PFET) and phosphorus for an n-type field effect transistor (NFET). The S/D regions 106 may include a semiconductor material, such as Si or Ge, a III-V compound semiconductor, a II-VI compound semiconductor, or other suitable semiconductor material. Exemplary S/D regions 106 may include, but are not limited to, Ge, SiGe, GaAs, AlGaAs, GaAsP, SiP, InAs, AlAs, InP, GaN, InGaAs, InAlAs, GaSb, AlP, GaP, and the like. The S/D regions 106 may include p-type dopants, such as boron; n-type dopants, such as phosphorus or arsenic; and/or other suitable dopants including combinations thereof. The S/D regions 106 may be formed by an epitaxial growth method using CVD, ALD or MBE. In this disclosure, a source region and a drain region are interchangeably used, and the structures thereof are substantially the same. Furthermore, source/drain region(s) may refer to a source or a drain, individually or collectively dependent upon the context.

As shown in FIG. 1, S/D regions 106 may be connected by one or more semiconductor layers 130, which may be channels of a FET. In some embodiments, the FET is a nanostructure FET including a plurality of semiconductor layers 130, and at least a portion of each semiconductor layer 130 is wrapped around by a gate electrode layer 136. The semiconductor layer 130 may be or include materials such as Si, Ge, SiC, GeAs, GaP, InP, InAs, InSb, GaAsP, AlInAs, AlGaAs, InGaAs, GaInP, GaInAsP, or other suitable material. In some embodiments, each semiconductor layer 130 is made of Si. The number of semiconductor layers 130 arranged vertically may range from about 2 to about 6. The gate electrode layer 136 includes one or more layers of electrically conductive material, such as polysilicon, aluminum, copper, titanium, tantalum, tungsten, cobalt, molybdenum, tantalum nitride, nickel silicide, cobalt silicide, TiN, WN, WCN, TiAl, TiTaN, TiAlN, TaN, TaCN, TaC, TaSiN, metal alloys, other suitable materials, and/or combinations thereof. In some embodiments, the gate electrode layer 136 includes a metal. A gate dielectric layer 134 may be disposed between the gate electrode layer 136 and the semiconductor layers 130. The gate dielectric layer 134 may include two or more layers, such as an interfacial layer and a high-k dielectric layer. In some embodiments, the interfacial layer is an oxide layer, and the high-k dielectric layer includes hafnium oxide ($HfO_2$), hafnium silicate (HfSiO), hafnium silicon oxynitride (HfSiON), hafnium aluminum oxide (HfAlO), hafnium lanthanum oxide (HfLaO), hafnium zirconium oxide (HfZrO), hafnium tantalum oxide (HMO), hafnium titanium oxide (HfTiO), lanthanum oxide (LaO), aluminum oxide (AlO), aluminum silicon oxide (AlSiO), zirconium oxide (ZrO), titanium oxide (TiO), tantalum oxide ($Ta_2O_5$), yttrium oxide ($Y_2O_3$), silicon oxynitride (SiON), hafnium dioxide-alumina ($HfO_2$—$Al_2O_3$) alloy, or other suitable high-k materials.

The gate dielectric layer 134 and the gate electrode layer 136 may be separated from the S/D epitaxial features 106 by inner spacers 132. The inner spacers 132 may include a dielectric material, such as SiON, SiCN, SiOC, SiOCN, or SiN. Spacers 128 may be disposed over the plurality of semiconductor layers 130. The spacers 128 may include a dielectric material such as silicon oxide, silicon nitride, silicon carbide, silicon oxynitride, SiCN, silicon oxycarbide, SiOCN, and/or combinations thereof. In some embodiments, a self-aligned contact (SAC) layer 140 is formed over the spacers 128, the gate dielectric layer 134, and the gate electrode layer 136, as shown in FIG. 1. The SAC layer 140 may include any suitable material such as SiO, SiN, SiC, SiON, SiOC, SiCN, SiOCN, AlO, AlON, ZrO, ZrN, or combinations thereof.

A contact etch stop layer (CESL) 118 and an interlayer dielectric (ILD) layer 120 are disposed over the S/D epitaxial features 106, as shown in FIG. 1. The CESL 118 may include an oxygen-containing material or a nitrogen-containing material, such as silicon nitride, silicon carbon nitride, silicon oxynitride, carbon nitride, silicon oxide, silicon carbon oxide, the like, or a combination thereof. The materials for the ILD layer 120 may include an oxide formed by tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. A cap layer 122 may be disposed on the ILD layer 120, and the cap layer 122 may include a nitrogen-containing material, such as SiCN.

Conductive features 126 may be disposed in the ILD layer 120 and over the S/D regions 106, as shown in FIG. 1. In some embodiments, conductive features 126 are conductive contacts. The conductive features 126 may include one or more electrically conductive material, such as Ru, Mo, Co, Ni. W, Ti, Ta, Cu, Al, TiN and TaN. Silicide layers 124 may be disposed between the conductive features 126 and the S/D regions 106.

As shown in FIG. 1, the semiconductor device structure 100 may include the substrate 102 and a device layer 200 disposed over the substrate 102. The device layer 200 may include one or more devices, such as transistors, diodes, imaging sensors, resistors, capacitors, inductors, memory cells, combinations thereof, and/or other suitable devices. In some embodiments, the device layer 200 includes transistors, such as nanostructure transistors having a plurality of channels wrapped around by the gate electrode layer, as described above. The term nanostructure is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The channel(s) of the semiconductor device structure 100 may be surrounded by the gate electrode layer. The nanostructure transistors may be referred to as nanosheet transistors, nanowire transistors, gate-all-around (GAA) transistors, multi-bridge channel (MBC) transistors, or any transistors having the gate electrode layer surrounding the channels. In some embodiments, the device layer 200 includes devices such as planar FET, FinFET, complementary FET (CFET), forksheet FET, or other suitable devices.

Figure 2:
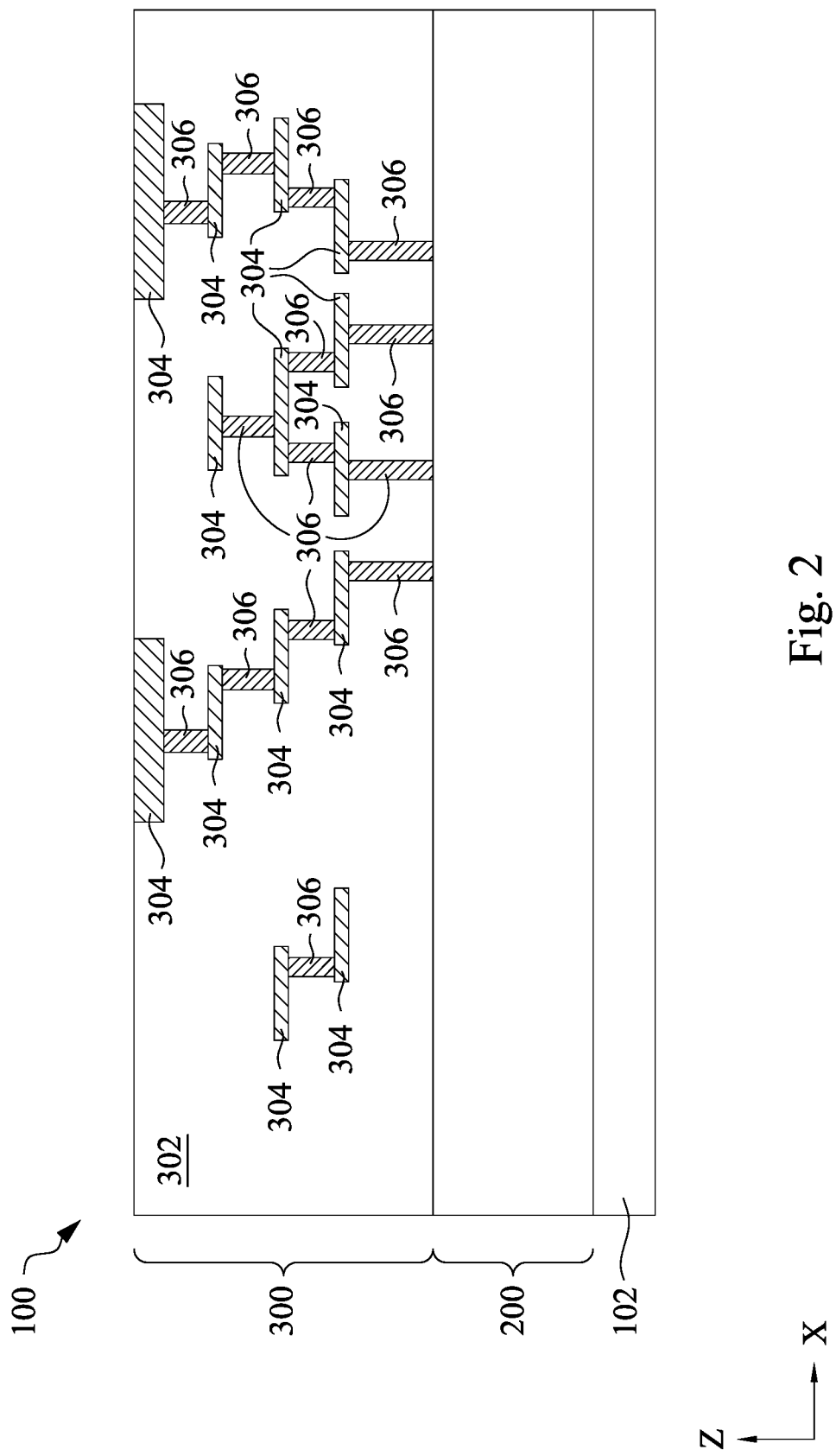
FIG. 2 is a cross-sectional side view of a stage of manufacturing the semiconductor device structure, in accordance with some embodiments.

The semiconductor device structure 100 may further include an interconnect structure 300 disposed over the device layer 200 and the substrate 102, as shown in FIG. 2. The interconnect structure 300 includes various conductive features, such as a first plurality of conductive features 304 and second plurality of conductive features 306, and an intermetal dielectric (IMD) layer 302 to separate and isolate various conductive features 304, 306. In some embodiments, the first plurality of conductive features 304 are conductive lines and the second plurality of conductive features 306 are conductive vias. The interconnect structure 300 includes multiple levels of the conductive features 304, and the conductive features 304 are arranged in each level to provide electrical paths to various devices in the device layer 200 disposed below. The conductive features 306 provide vertical electrical routing from the device layer 200 to the conductive features 304 and between conductive features 304. For example, the bottom-most conductive features 306 of the interconnect structure 300 may be electrically connected to the conductive features 126 (FIG. 1) and the gate electrode layer 136 (FIG. 1). The conductive features 304 and conductive features 306 may be made from one or more electrically conductive materials, such as metal, metal alloy, metal nitride, or silicide. For example, the conductive features 304 and the conductive features 306 are made from copper, aluminum, aluminum copper alloy, titanium, titanium nitride, tantalum, tantalum nitride, titanium silicon nitride, zirconium, gold, silver, cobalt, nickel, tungsten, tungsten nitride, tungsten silicon nitride, platinum, chromium, molybdenum, hafnium, other suitable conductive material, or a combination thereof.

The IMD layer 302 includes one or more dielectric materials to provide isolation functions to various conductive features 304, 306. The IMD layer 302 may include multiple dielectric layers embedding multiple levels of conductive features 304, 306. The IMD layer 302 is made from a dielectric material, such as $SiO_x$, $SiO_xC_yH_z$, or $SiO_xC_y$, where x, y and z are integers or non-integers. In some embodiments, the IMD layer 302 includes a low-k dielectric material having a k value less than that of silicon oxide.

Figures 3G, 3H:
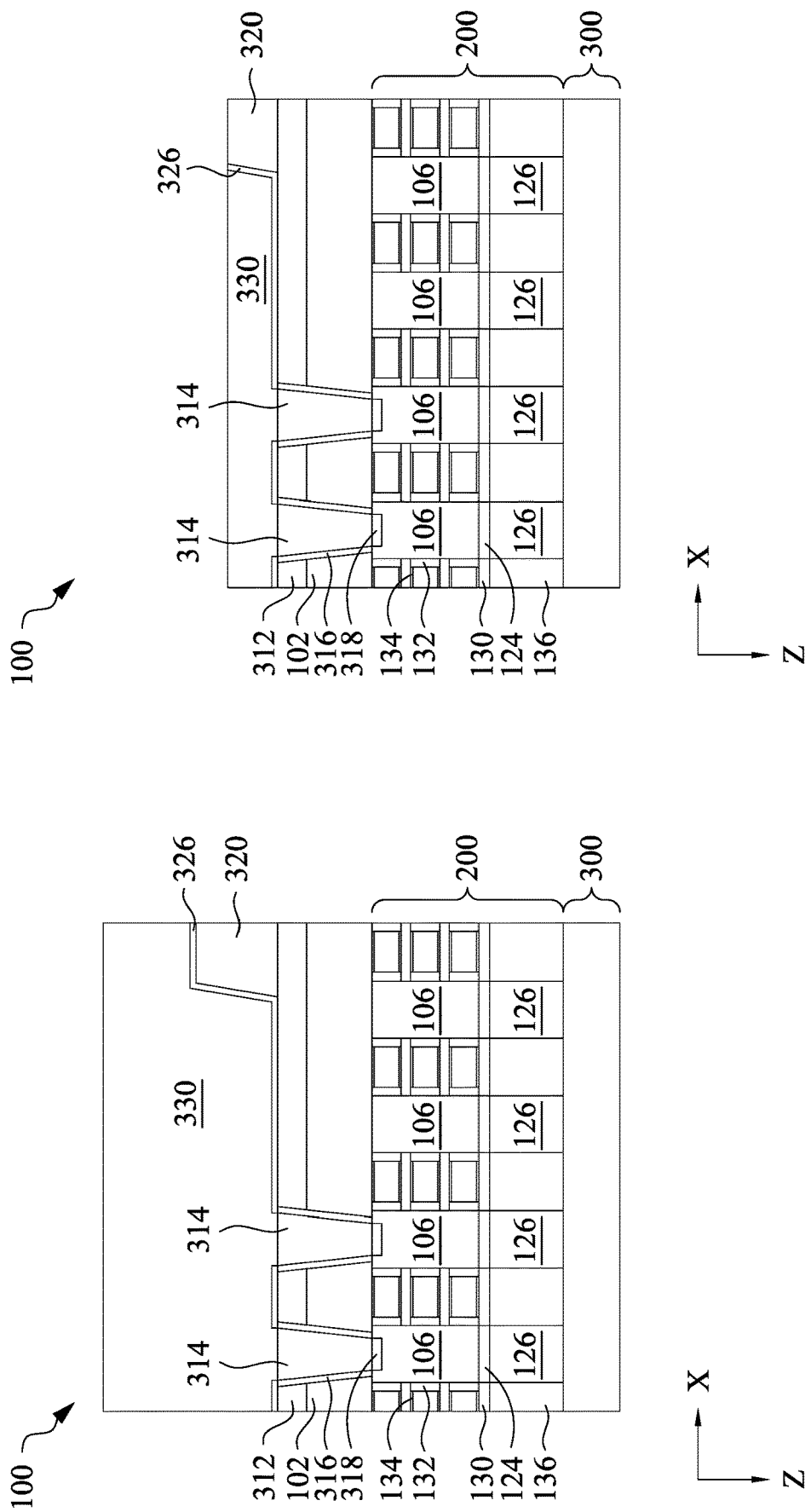

FIGS. 3A-3H are cross-sectional side views of various stages of manufacturing the semiconductor device structure 100, in accordance with some embodiments. After forming the interconnect structure 300 and other back-end-of-line (BEOL) processes, the semiconductor device structure 100 is flipped over for backside processing. As shown in FIG. 3A, a hard mask layer 312 is formed on a back surface of the substrate 102. Some features, such as the ILD layer 120, the CESL 118, the cap layer 122, the SAC layer 140, the spacers 128, and the gate dielectric layer 134 are omitted to avoid obscuring other components or features, which is for ease of depicting the figures. In some embodiments, the substrate 102 is thinned down from the back side before forming the hard mask layer 312. The hard mask layer 312 may include any suitable material. In some embodiments, the hard mask layer 312 includes a dielectric material, such as SiN, SiCN, SiOCN, SiON, or other suitable dielectric material. Conductive features 314 are formed in the hard mask layer 312 and the substrate 102, as shown in FIG. 3A. In some embodiments, the conductive features 314 are conductive vias. Each conductive feature 314 includes an electrically conductive material, such as Co, W, Ru, Mo, Cu, or other suitable material. In some embodiments, liners 316 may be formed on side surfaces of each conductive feature 314. Each liner 316 may include SiN, SiCN, SiOCN, SiON, or other suitable material. In some embodiments, the liners 316 include the same material as the hard mask layer 312. In some embodiments, the liners 316 are formed by first forming a conformal layer in openings formed in the hard mask layer 312 and the substrate 102, followed by an anisotropic etch process to remove horizontal portions of the conformal layer to form the liners 316 on the side surfaces of the hard mask layer 312 and the substrate 102. Each liner 316 may have a thickness ranging from about 0.5 nm to about 3 nm. Each conductive feature 314 is formed in the openings and between two liners 316, as shown in FIG. 3A. A planarization process, such as a chemical-mechanical polishing (CMP) process, may be performed to remove portions of the conductive features 314 formed on the hard mask layer 312.

A silicide layer 318 is formed between each conductive feature 314 and a corresponding S/D region 106. The silicide layer 318 may include TiSi, CoSi, NiSi, TiNiSi, or other suitable material. The silicide layer 318 may have a thickness ranging from about 2 nm to about 8 nm. In some embodiments, an optional glue layer 402 (FIG. 4) may be formed between the liners 316 and the conductive feature 314 and between the silicide layer 318 and the conductive feature 314. The glue layer 402 may include TiN, TaN, TiSiN, TiNiSiN, NiSiN, CoSiN, combinations thereof, or other suitable material. The glue layer 402 may be formed by first forming a conformal layer in openings formed in the hard mask layer 312 and the substrate 102, followed by a nitridation process to convert the outer portions of the conformal layer to the glue layer 402. The conformal layer may be a metal layer, such as Ti, Co, Ni, combinations thereof, or other suitable material. A portion of the conformal layer in contact with the S/D region 106 may be converted to the silicide layer 318. In some embodiments, the silicide layer 318 is selectively formed on the S/D region 106, and the glue layer 402 is not present. The glue layer 402 may have a thickness ranging from about 1 nm to about 5 nm.

As shown in FIG. 3B, a dielectric layer 320 is formed on the hard mask layer 312 and the conductive features 314. The dielectric layer 320 may include any suitable dielectric material. In some embodiments, the dielectric layer 320 includes the same material as the hard mask layer 312. As shown in FIG. 3C, an opening 322 is formed in the dielectric layer 320 to expose a portion of the hard mask layer 312 and the conductive features 314. In some embodiments, the opening 322 exposes a portion of a top surface of one of the conductive features 314. For example, the dielectric layer 320 may be formed on a first portion 404 (FIG. 5) of one of the conductive features 314, and a second portion 406 (FIG. 5) of the one of the conductive features 314 is exposed.

As shown in FIG. 3D, blocking layers 324 are selectively formed on corresponding conductive features 314. The blocking layers 324 may be also formed on the glue layer in embodiments where the glue layer is present. Each blocking layer 324 may be an organic or organic-like film, such as amphiphilic-like molecules. In some embodiments, the blocking layer 324 may include one or more self-assembled monolayers (SAMs) having a head group and a tail group. The head group of the SAM may be selected depending on the material of the conductive feature 314. For example, the head group of the SAM may include an azole group-containing compound when Cu or Co is used as the conductive feature 314, or a compound terminated with an alkyne group when Ru is used as the conductive feature 314. In some embodiments, the head group of the SAM may include a phosphorus (P), sulfur (S), silicon (Si), or nitrogen (N) terminated compound which may only attach to the metallic surfaces of the conductive features 314. The head group of the SAM may not form on the dielectric surface of the hard mask layer 312, the liners 316, and the dielectric layer 320. The tail group of the SAM may include a highly hydrophobic long alkyl chain which blocks adsorption of a precursor (e.g., precursor for forming the subsequent barrier layer 326 (FIG. 3E)) from forming on the blocking layer 324. In some embodiments, the tail group includes a polymer such as polyimide. The blocking layer 324 may be formed by supplying a blocking agent to the exposed surfaces, for example by CVD, ALD, molecular layer deposition (MLD), wet coating, immersion process, or other suitable methods.

In some embodiments, the blocking layer 324 is formed by a wet-coating process, and the solution for wet coating may be a protic organic solvent such as alcohols, carboxylic acids, or a combination thereof. Exemplary protic organic solvents may include, but are not limited to, methanol, ethanol, 1-propanol, 2-propanol, 1-butanol, 1-pentanol, 1-hexanol, 1-heptanol, 2-ethoxyethanol, and mixtures thereof. The solution for wet coating may also be a polar or nonpolar protic solvent. Exemplary polar aprotic solvents may include, but are not limited to, N,N-dimethylformamide, N-methyl-2-pyrrolidinone, acetonitrile, acetone, ethyl acetate, benzyl ether, trioctylphosphine, trioctylphosphine oxide, and mixtures thereof. Exemplary nonpolar protic solvents may include, but are not limited to, alkane, olefin, an aromatic, an ester or an ether solvent, hexane, octane, benzene, toluene, xylene, and mixtures thereof. It is contemplated that the wet-coating process herein is applicable to formation of other blocking layer discussed in this disclosure.

In the embodiment where the second portion 406 (FIG. 5) of one of the conductive features 314 is exposed, the blocking layer 324 is selectively formed on the exposed second portion 406 (FIG. 5) of the conductive feature 314.

As shown in FIG. 3E, a barrier layer 326 is deposited on exposed dielectric surfaces in the opening 322, such as the hard mask layer 312, the liners 316, and the dielectric layer 320. The barrier layer 326 may extend over a portion of the glue layer in embodiments where the glue layer is present. The barrier layer 326 serves to prevent the metal diffusion from the subsequently formed conductive feature 328 (FIG. 3G) to the hard mask layer 312 and the dielectric layer 320. In some embodiments, the subsequently formed conductive feature 328 includes a material that is not susceptible to diffusion, and the barrier layer 326 is not used. With the blocking layers 324 formed on the metallic surfaces of the conductive features 314, the barrier layer 326 is selectively formed on the hard mask layer 312, the liners 316, and the dielectric layer 320, and the barrier layer 326 is not formed on the blocking layer 324. The selective deposition of the barrier layer 326 is achieved through the use of the blocking layer 324. For example, the blocking layer 324 may block the barrier layer 326 from forming on the metallic surfaces of the conductive features 314. Specifically, the blocking layer 324 blocks the precursor(s) of the barrier layer 326 from forming thereon. The selective deposition of the barrier layer 326 can also be achieved and/or enhanced through the use of ALD process and/or MLD process so that the barrier layer 326 has the characteristic or property of being specific in bonding with the hard mask layer 312, the liners 316, and the dielectric layer 320 through self-limiting surface reactions.

The barrier layer 326 may include TiN, TaN, Ru, Co, or other suitable material. The barrier layer 326 may be formed by a conformal process, such as ALD. The barrier layer 326 may have a thickness ranging from about 2 nm to about 10 nm. In some embodiments, the barrier layer 326 and the glue layer 402 (FIG. 4) include different materials.

As shown in FIG. 3F, after the formation of the barrier layer 326, the blocking layers 326 are removed to expose the top surfaces of the conductive features 314. The blocking layer 324 may be removed by any suitable process, such as plasma dry etching, wet etching, chemical etching, ashing, or etching and ashing. The removal process may be a selective process that does not substantially affect the barrier layer 326 or the conductive features 314. The removal of the blocking layers 324 forms gaps in the barrier layer 32, as shown in FIG. 3F.

As shown in FIG. 3G, a conductive feature 330 is formed on the barrier layer 326 and the conductive features 314. The conductive feature 330 may be a conductive line. The conductive feature 330 fills the gaps in the barrier layer 326 left by the removal of the blocking layers 324. The conductive feature 330 includes an electrically conductive material, such as Ru, Cu, Co, Mo, alloys thereof, or combinations thereof. As shown in FIG. 3G, the conductive feature 330 is in direct contact with the conductive features 314 (or with the secundo portion 406 (FIG. 5) of the conductive feature 316). As a result, interface resistance between the conductive feature 330 and the conductive features 314 is reduced.

As shown in FIG. 3H, a planarization process, such as a CMP process, is performed to expose the dielectric layer 320. The planarization process removes a portion of the conductive feature 330 and a portion of the barrier layer 326 disposed on the dielectric layer 320. As a result, the conductive feature 330 may have a thickness ranging from about 10 nm to about 50 nm.

Figure 4:
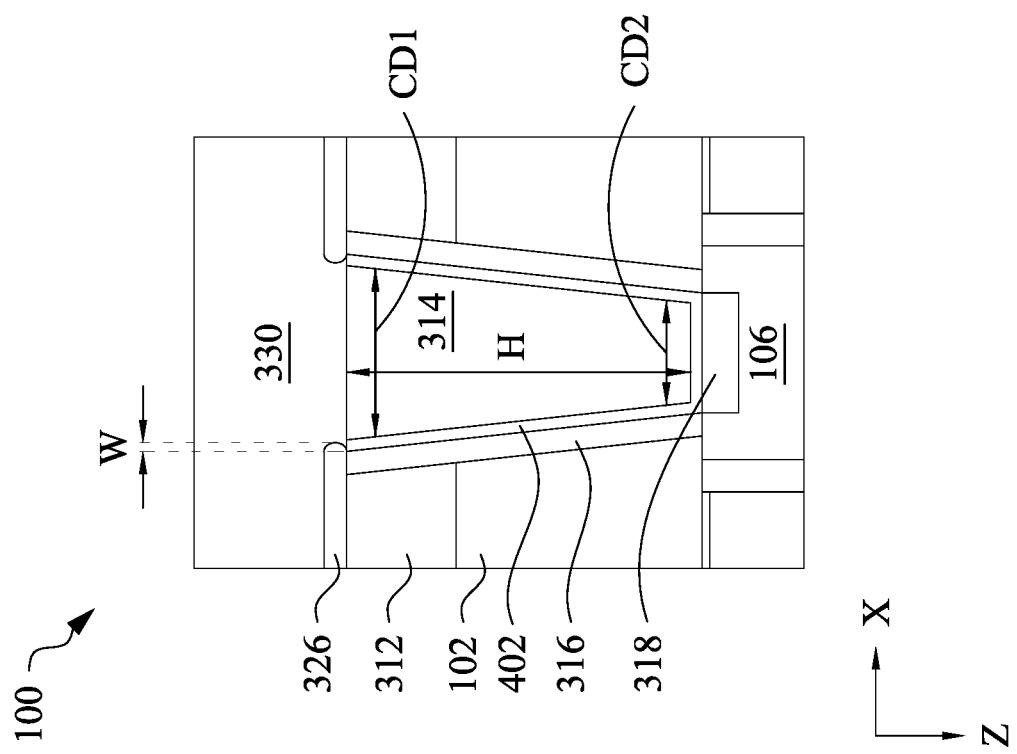
FIG. 4 is an enlarged portion of a conductive feature of FIG. 3H, in accordance with some embodiments.

FIG. 4 is an enlarged portion of a conductive feature 314 of FIG. 3H, in accordance with some embodiments. As shown in FIG. 4, the glue layer 402 is formed between the liners 316 and the conductive feature 314 and between the silicide layer 318 and the conductive feature 314. The conductive feature 314 has a height H ranging from about 20 nm to about 50 nm, a top critical dimension CD1 ranging from about 10 nm to about 25 nm, and a bottom critical dimension CD2 ranging from about 8 nm to about 20 nm. In some embodiments, the bottom critical dimension CD2 is substantially less than the top critical dimension CD1. As shown in FIG. 4, in some embodiments, a portion of the barrier layer 326 extends over the glue layer 402, and the portion of the barrier layer 326 has a width W ranging from about 1 nm to about 5 nm.

Figure 5:
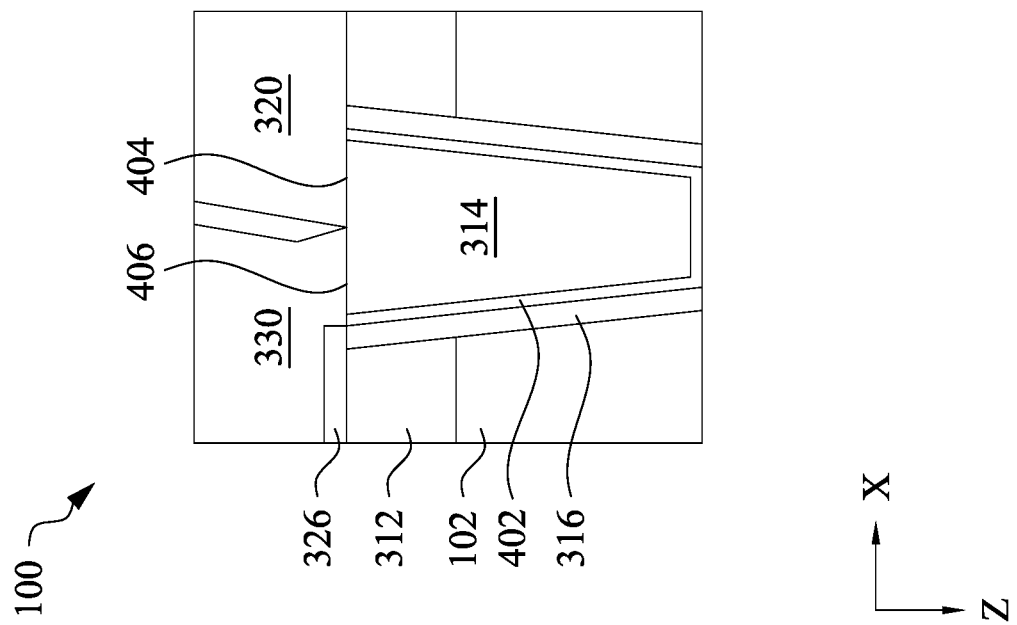
FIG. 5 is an enlarged portion of the conductive feature of FIG. 3H, in accordance with alternative embodiments.

FIG. 5 is an enlarged portion of the conductive feature 314 of FIG. 3H, in accordance with alternative embodiments. As shown in FIG. 5, one of the conductive features 314 includes the first portion 404 and the second portion 406. The dielectric layer 320 is disposed on the first portion 404, and the conductive feature 330 is disposed on the second portion 406. The conductive feature 330 partially lands on the conductive feature 314. As a result of using the blocking layer 324, the barrier layer 326 is not formed on the second portion 406 of the conductive feature 314, and the conductive feature 330 is in direct contact with the second portion 406 of the conductive feature 314. As a result, interface resistance between the conductive feature 330 and the second portion 406 of the conductive feature 314 is reduced.

Figure 6B:
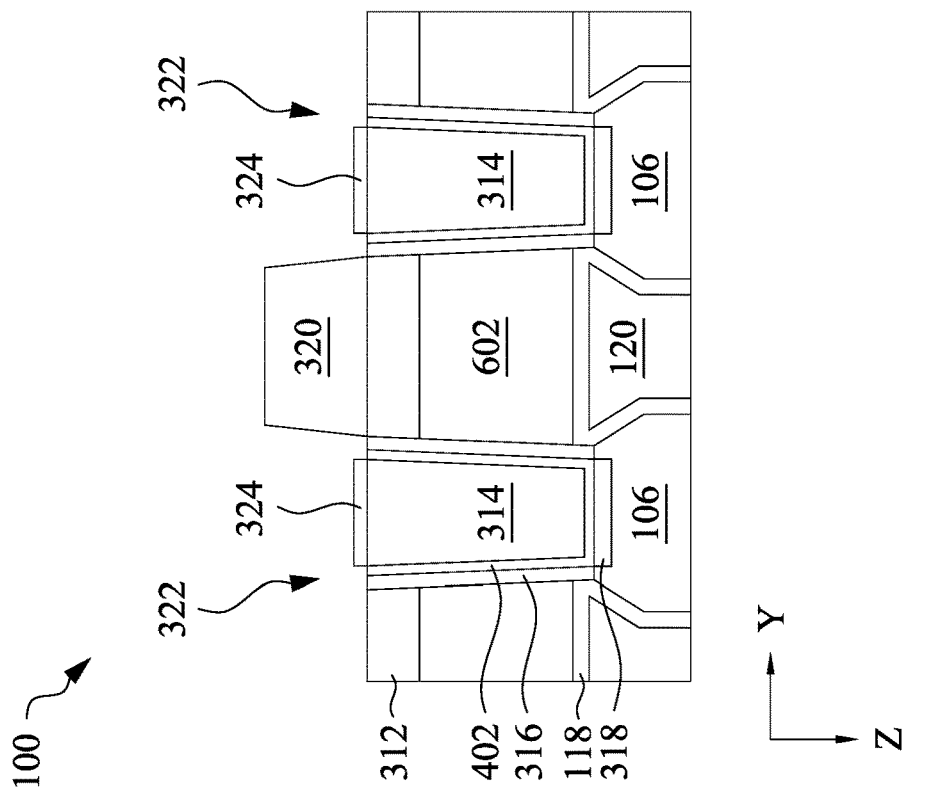
FIGS. 6A-6F are cross-sectional side views of various stages of manufacturing the semiconductor device structure, in accordance with some embodiments.
Figure 6A:
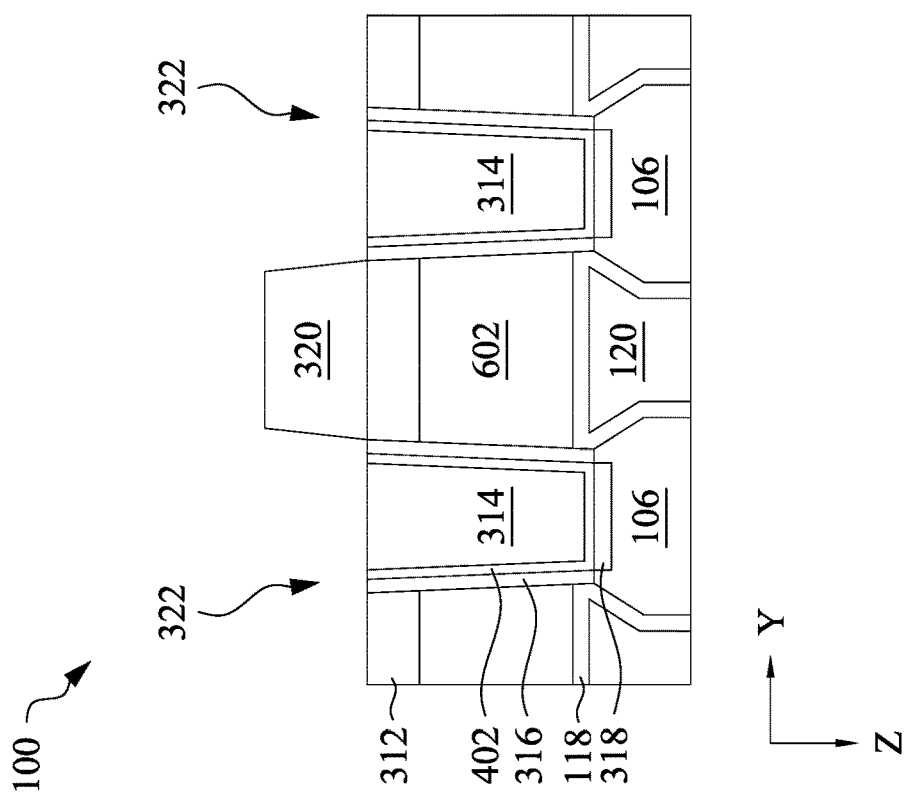

FIGS. 6A-6F are cross-sectional side views of various stages of manufacturing the semiconductor device structure 100, in accordance with some embodiments. FIGS. 3A-3H illustrate cross-sections in the channel regions along a fin direction, while FIGS. 6A-6F illustrate cross-sections in the S/D regions along a gate direction, which is substantially perpendicular to the fin direction. As shown in FIG. 6A, the conductive features 314 are formed in a layer 602. The layer 602 may include an isolation region and the substrate 102 as shown in FIG. 3A. In some embodiments, instead of thinning down the substrate 102 as described in FIG. 3A, the substrate 102 is completely removed and replaced with a dielectric material. The layer 602 may include the isolation region and the dielectric material. In some embodiments, the isolation region and the dielectric material include the same dielectric material. The hard mask layer 312 is formed on the layer 602. The dielectric layer 320 is formed on the hard mask layer 312, and the openings 322 are formed in the dielectric layer 320. As shown in FIG. 6A, the conductive features 314 are exposed in the openings 322. In some embodiments, the dielectric layer 320 covers a portion of one or more of the conductive features 314.

Figure 6D:
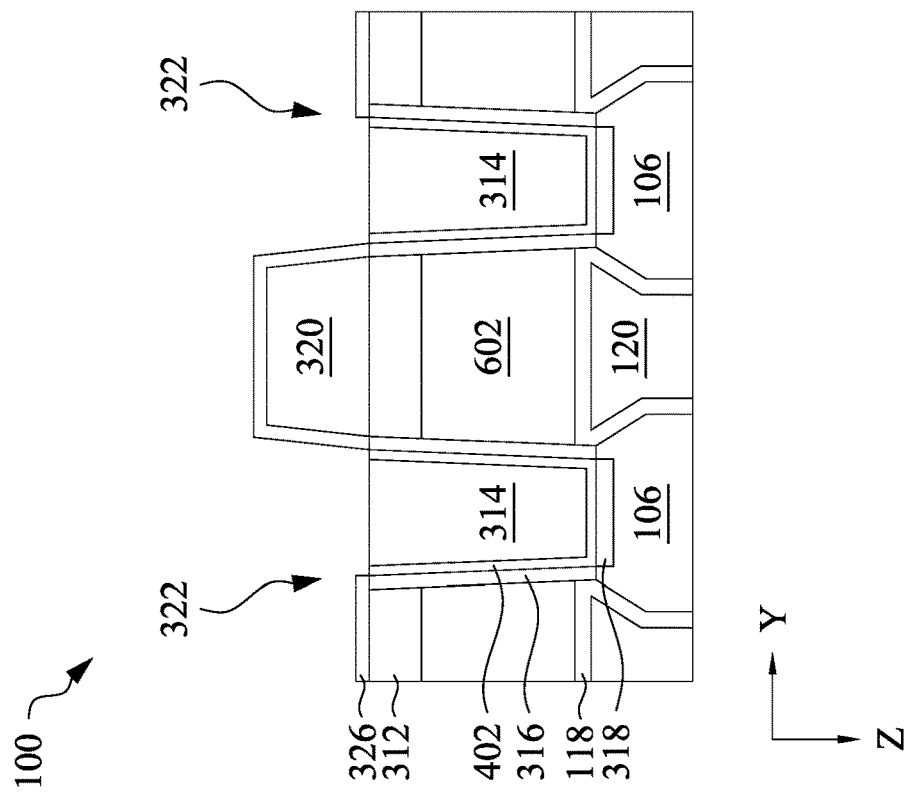
Figure 6C:
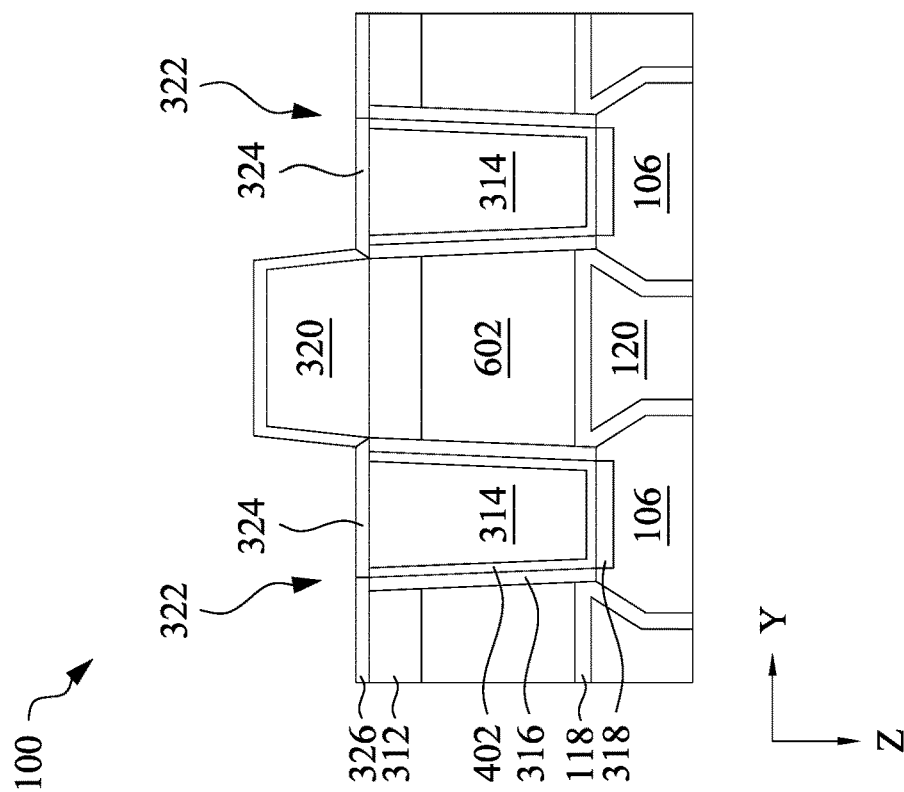
Figure 6F:
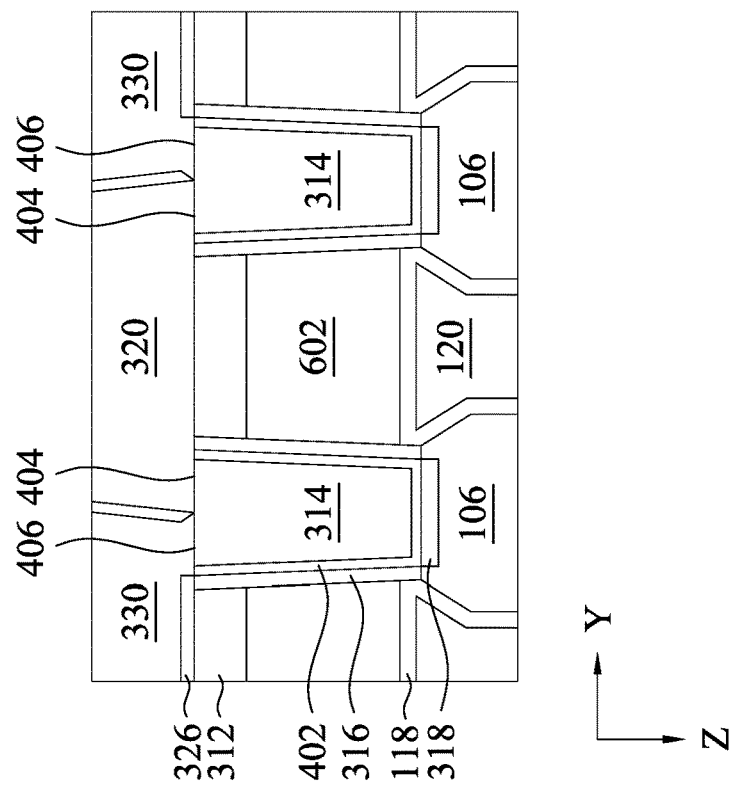
Figure 6E:
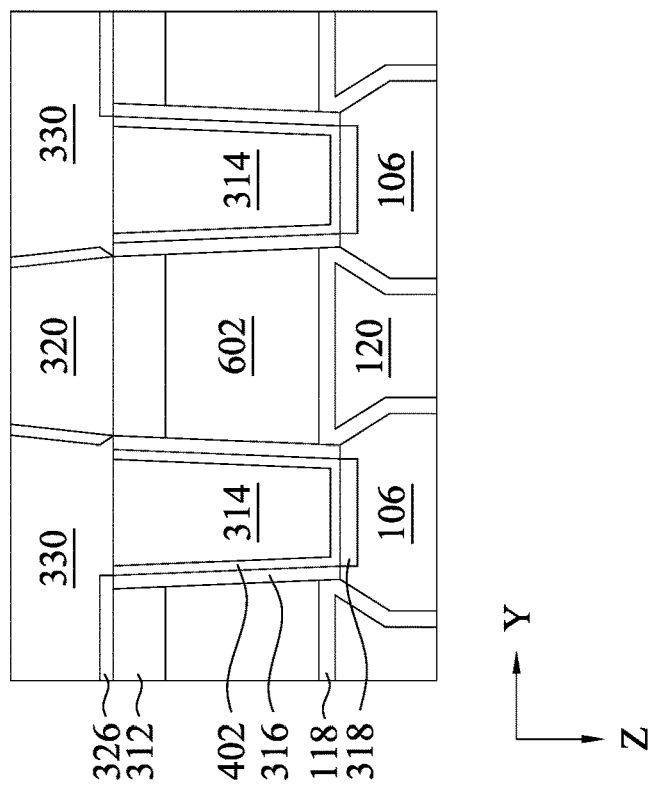

As shown in FIG. 6B, the blocking layers 324 are selectively formed on corresponding conductive features 314. The blocking layers 324 may be also formed on the glue layer 402. As shown in FIG. 6C, the barrier layers 326 are selectively formed on the hard mask layer 312 and the dielectric layer 320. In some embodiments, the barrier layers 326 are separated from the glue layers 402 due to the presence of the blocking layers 324. In other words, the barrier layers 326 are not in contact with the glue layers 402, in some embodiments. As shown in FIG. 6D, the blocking layers 324 are removed to expose the conductive features 314. As shown in FIG. 6E, the conductive features 330 are formed on the barrier layer 326 and the conductive features 314. In some embodiments, the conductive features 330 are in contact with the glue layers 402. The conductive features 330 fills the openings 322, and a planarization process may be performed to remove a portion of the conductive features 330 and a portion of the barrier layer 326 to expose the dielectric layer 320. FIG. 6F illustrates the embodiment that the conductive features 330 are partially landing on the corresponding conductive features 314. For example, each conductive feature 330 is formed on the second portion 406 of the corresponding conductive feature 314, and the dielectric layer 320 is formed on the first portions 404 of the conductive features 314.

Figure 7B:
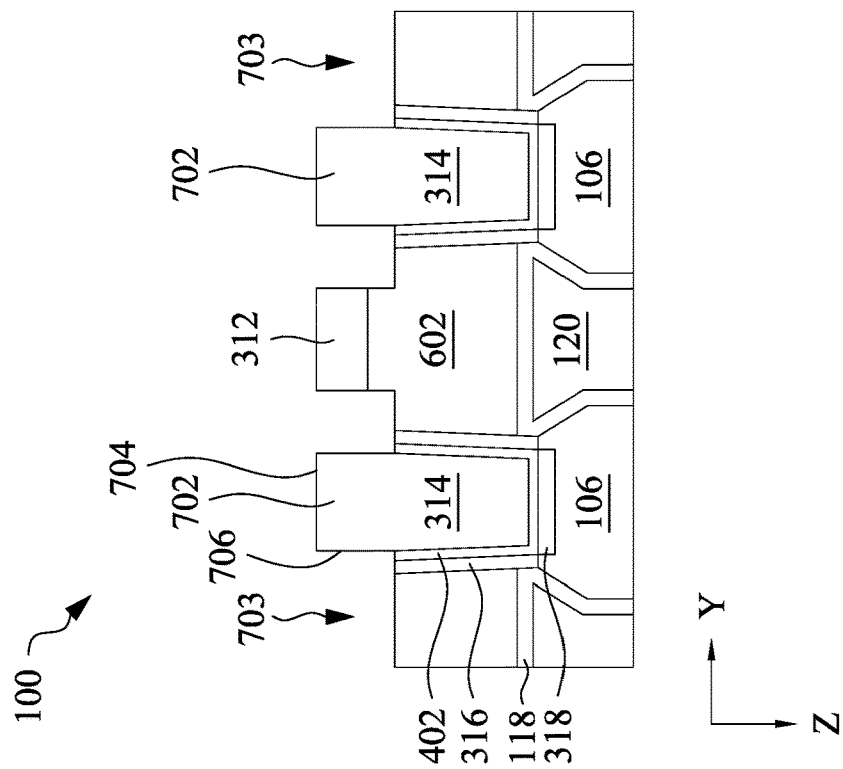
FIGS. 7A-7J are cross-sectional side views of various stages of manufacturing the semiconductor device structure, in accordance with alternative embodiments.
Figure 7A:
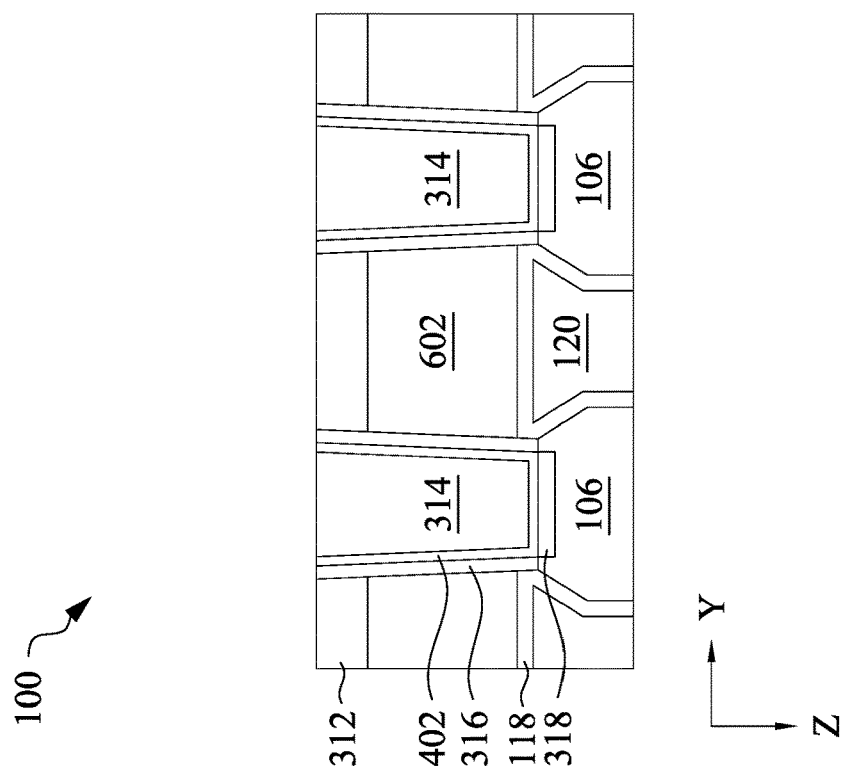

FIGS. 7A-7J are cross-sectional side views of various stages of manufacturing the semiconductor device structure 100, in accordance with alternative embodiments. As shown in FIG. 7A, the conductive features 314 are formed in the hard mask layer 312 and the layer 602. Next, as shown in FIG. 7B, an upper portion 702 of each conductive feature 314 is exposed by removing portions of the hard mask layer 312 and portions of the layer 602. Portions of the glue layers 402 and portions of the liners 316 may be also removed. The removal of the portions of the hard mask layer 312, the layer 602, the liners 316, and the glue layers 402 may be performed by one or more etch processes that do not substantially affect the conductive features 314. The removal of the portions of the hard mask layer 312, the layer 602, the liners 316, and the glue layers 402 forms openings 703, and the upper portion 702 of each conductive feature 314 is exposed in a corresponding opening 703. In some embodiments, the remaining liners 336 and the glue layers 402 may have top surfaces substantially coplanar with an exposed horizontal surface of the remaining layer 602, as shown in FIG. 7B. In some embodiments, the remaining liners 336 and glue layers 402 may have top surfaces at a level substantially higher or lower than a level of the exposed horizontal surface of the layer 602. In some embodiments, the layer 602 may include a portion protruding from the exposed horizontal surface. The portion of the layer 602 is located under the hard mask layer 312. As shown in FIG. 7B, the upper portion 702 of the conductive feature 314 includes a top surface 704 and side surfaces 706, which are exposed.

Figure 7C:
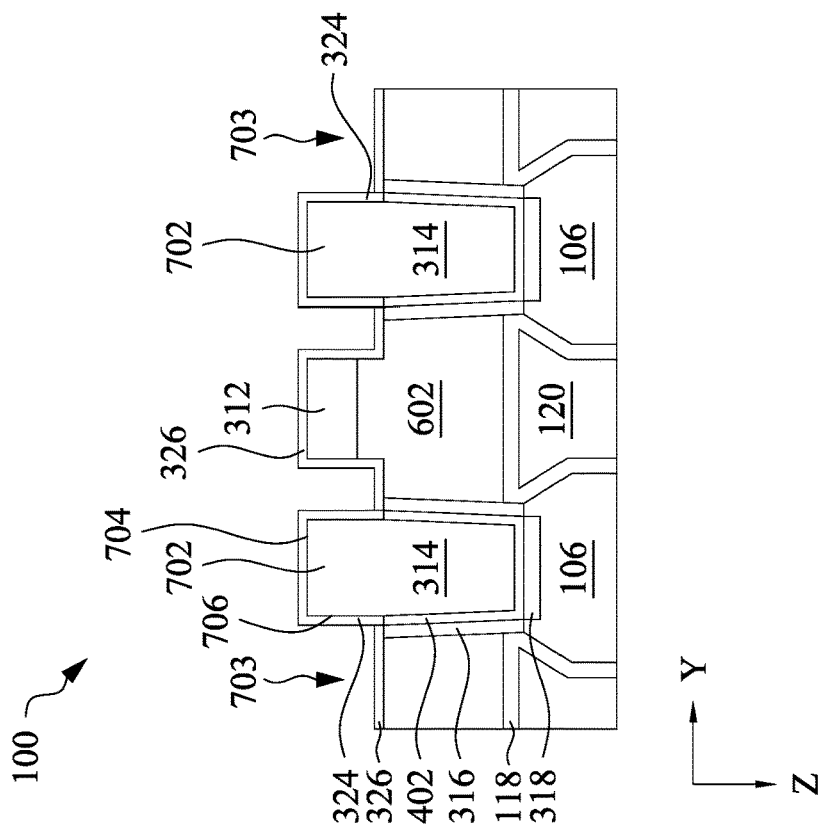
Figure 7D:
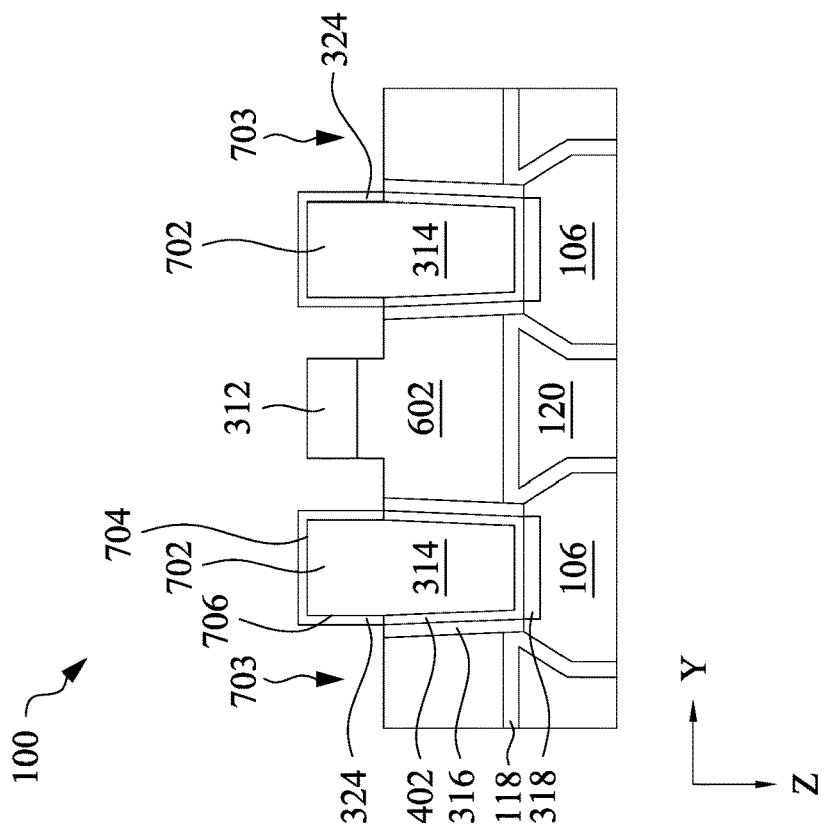
Figure 7F:
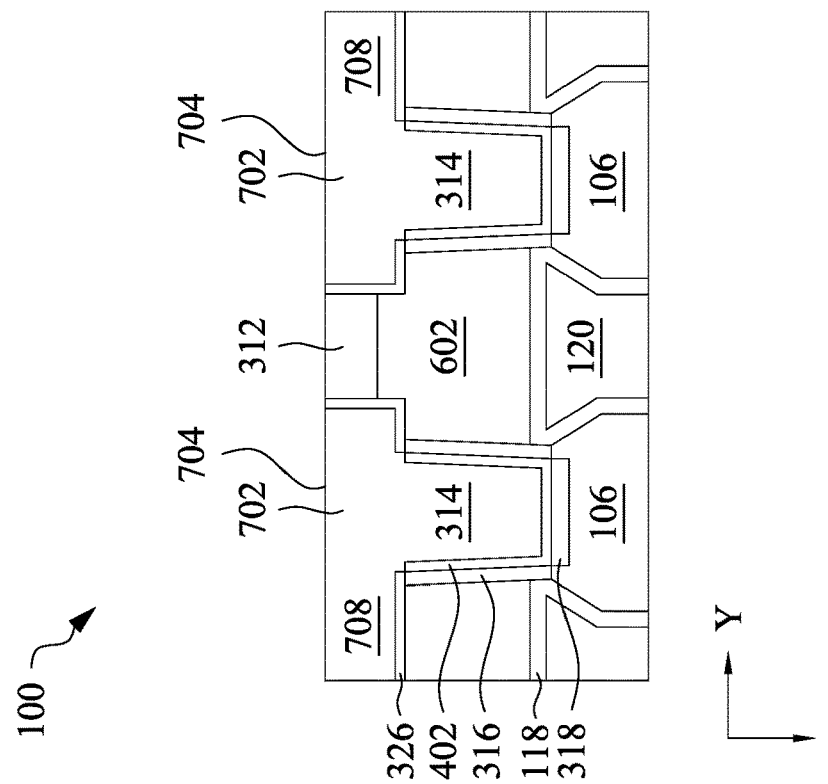
Figure 7E:
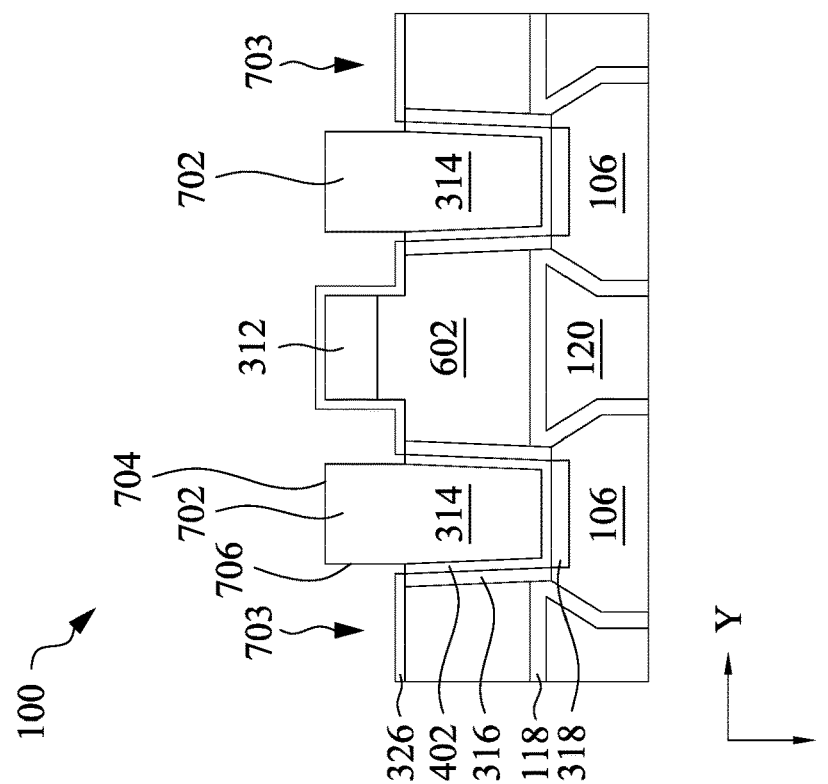

As shown in FIG. 7C, the blocking layers 324 are selectively formed on the upper portions 702 of corresponding conductive features 314. Each blocking layer 324 is selectively formed on the exposed top surface 704 and the exposed side surfaces 706. Next, as shown in FIG. 7D, the barrier layers 326 are selectively formed on the layer 602, the liners 316, and the hard mask layer 312. In some embodiments, the barrier layers 326 are separated from the glue layers 402 due to the presence of the blocking layers 324. In other words, the barrier layers 326 are not in contact with the glue layers 402, in some embodiments. Next, as shown in FIG. 7E, the blocking layers 324 are selectively removed, exposing the top surface 704 and the side surfaces 706 of the upper portion 702 of each conductive feature 314. As shown in FIG. 7F, conductive features 708 are formed on the barrier layers 326 and in contact with one or more side surfaces 706 of the upper portion 702 of the conductive feature 314. The conductive features 708 may be formed by first depositing a conductive material in the openings 703 and the on the top surfaces 704 of the upper portions 702 of the conductive features 314. Then, a planarization process, such as a CMP process, is performed to expose the top surfaces 704 and the hard mask layer 312. The planarization process forms multiple conductive features 708 from the conductive material, as shown in FIG. 7F. The conductive feature 708 may include the same material as the conductive feature 314. In some embodiments, the conductive feature 708 and the conductive feature 314 include different materials. As described above, the barrier layers 326 are separated from the glue layers 402. In some embodiments, the conductive feature 708 is in contact with the glue layer 402. In some embodiments, the conductive feature 708 together with the upper portion 702 of the conductive feature 314 form a conductive line.

Figure 7H:
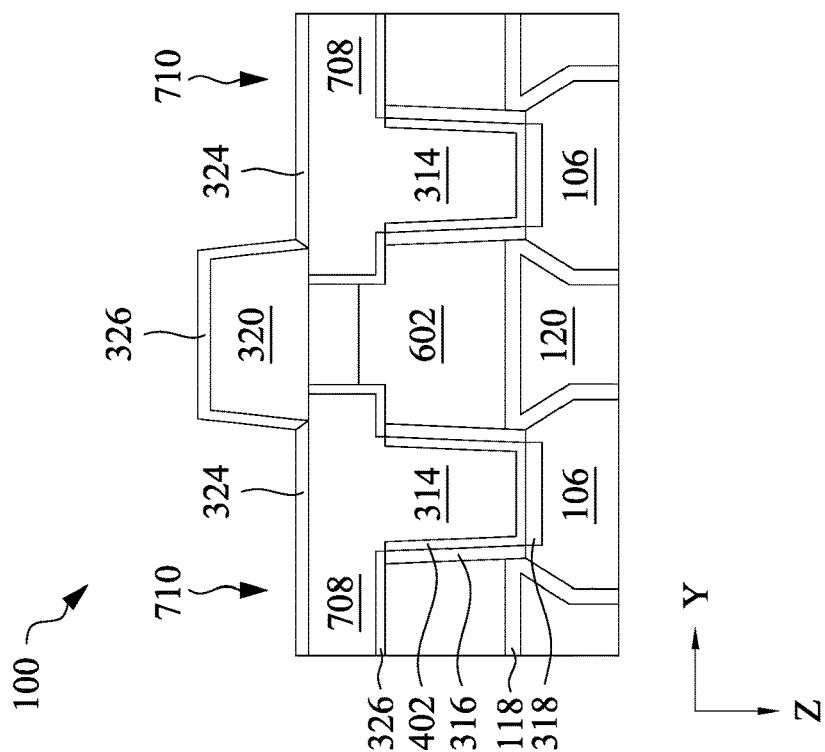
Figure 7G:
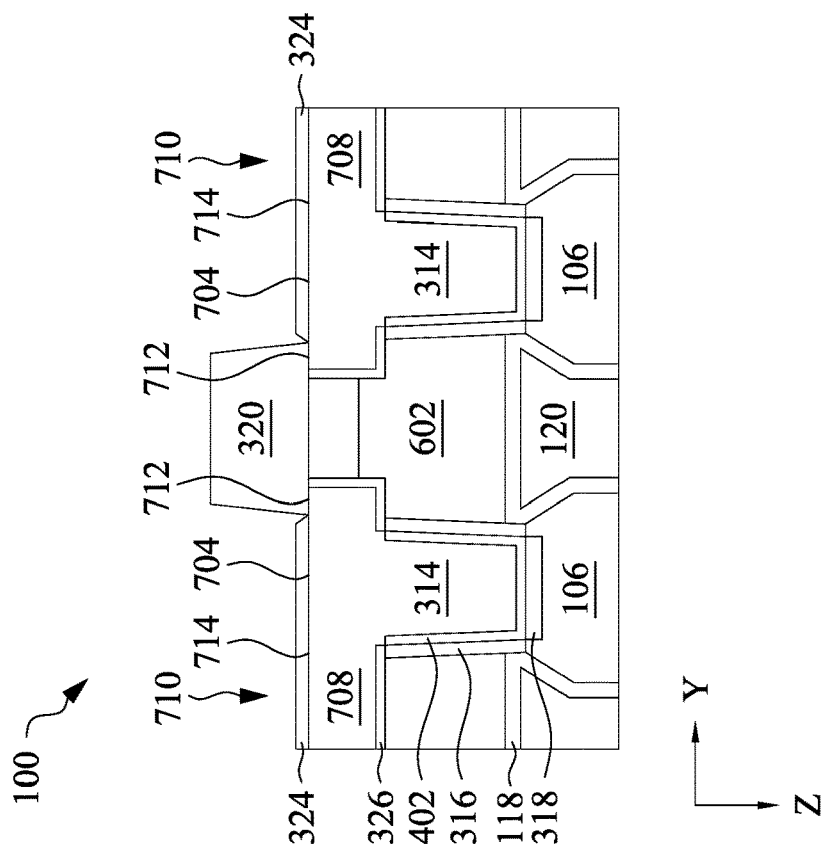

As shown in FIG. 7G, the dielectric layer 320 is formed on the hard mask layer 312, portions of the conductive features 708, and the barrier layers 326 formed on side surfaces of the hard mask layer 312. In some embodiments, the dielectric layer 320 is formed on a first portion 712 of each conductive feature 708, as shown in FIG. 7G. Openings 710 are formed in the dielectric layer 320, and a second portion 714 of each conductive feature 708 and the top surface 704 of each conductive feature 314 are exposed in the corresponding opening 710. Then, the blocking layer 324 is selectively formed on the exposed second portion 714 and top surface 704 in each opening 710, as shown in FIG. 7G.

Figure 7J:
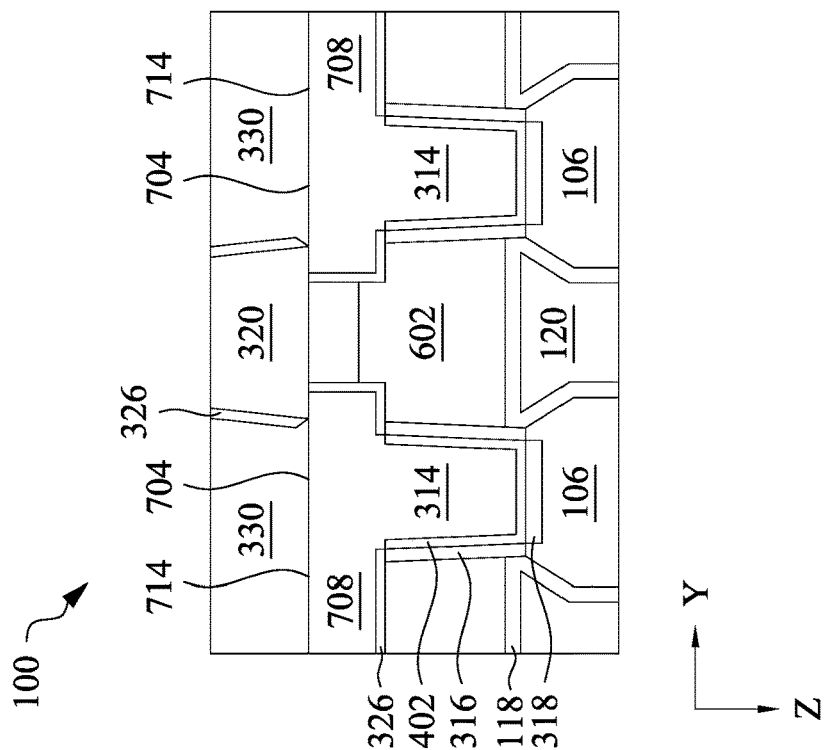
Figure 7I:
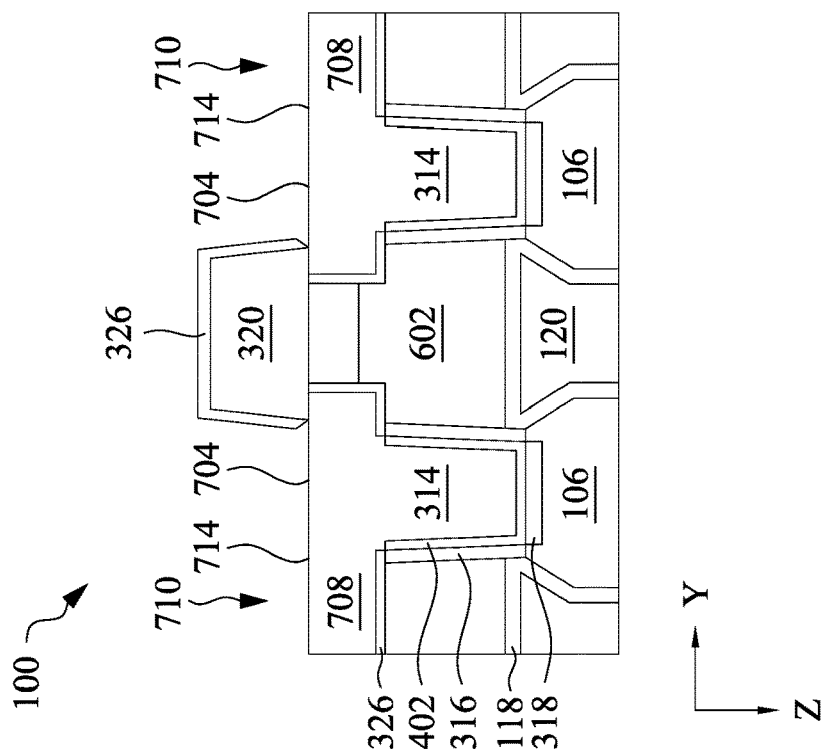

As shown in FIG. 7H, the barrier layer 326 is selectively formed on the dielectric layer 320. Next, as shown in FIG. 7I, the blocking layers 324 are selectively removed to expose the second portions 714 and the top surfaces 704. Next, as shown in FIG. 7J, the conductive features 330 are formed in the openings 710. Each conductive feature 330 is in direct contact with the second portion 714 of the conductive feature 708 and the top surface 704 of the conductive feature 314. As a result, interface resistance is reduced.

FIGS. 8A-8C are bottom views of the semiconductor device structure 100, in accordance with some embodiments. As shown in FIG. 8A, the gate electrode layer 136 is disposed between S/D regions 106, and the conductive features 314 are electrically connected to the S/D regions 106. In some embodiments, each conductive feature 314 is electrically connected to a source region 106. The conductive feature 330 is in direct contact with the conductive feature 314 as a result of selectively forming the barrier layer 326. The interface resistance between the conductive feature 314 and the conductive feature 330 is reduced. Each conductive feature 330 may be electrically connected to a conductive feature 802, which may be a power rail for supplying power to the S/D regions 106 from the backside.

As shown in FIG. 8B, each conductive feature 330 is in direct contact with the second portion 406 of the conductive feature 314. In other words, the conductive features 330 shown in FIG. 8B partially land on conductive features 314. The conductive feature 330 is in direct contact with the second portion 406 of the conductive feature 314 as a result of selectively forming the barrier layer 326. The interface resistance between the second portion 406 of the conductive feature 314 and the conductive feature 330 is reduced. As shown in FIG. 8C, the conductive feature 708 is formed adjacent two side surfaces of the conductive feature 314, and the conductive feature 330 is in direct contact with the second portion 406 of the conductive feature 314 and a portion of the conductive feature 708. The conductive feature 330 is in direct contact with the second portion 406 of the conductive feature 314 and the portion of the conductive feature 708 as a result of selectively forming the barrier layer 326. The interface resistance between the second portion 406 of the conductive feature 314 and the conductive feature 330 and between the portion of the conductive feature 708 and the conductive feature 330 is reduced.

The present disclosure in various embodiments provides a conductive feature 314 formed on the backside of a semiconductor device structure 100 and a conductive feature 330 in direct contact with at least a portion of the conductive feature 314. Some embodiments may achieve advantages. For example, by direct contacting the conductive feature 330 and at least a portion of the conductive feature 314, interface resistance between the conductive feature 330 and the conductive feature 314 is reduced.

An embodiment is a semiconductor device structure. The structure includes a source/drain region and a first conductive feature disposed below the source/drain region. The first conductive feature is electrically connected to the source/drain region. The structure further includes a second conductive feature disposed over the source/drain region, and the second conductive feature is electrically connected to the source/drain region. The structure further includes a third conductive feature disposed on and in contact with a first portion of the second conductive feature and a dielectric layer disposed on and in contact with a second portion of the second conductive feature.

Another embodiment is a semiconductor device structure. The structure includes a source/drain region and a first conductive feature disposed below the source/drain region. The first conductive feature is electrically connected to the source/drain region. The structure further includes a second conductive feature disposed over the source/drain region, and the second conductive feature is electrically connected to the source/drain region. The structure further includes a third conductive feature in contact with an upper portion of the second conductive feature and a fourth conductive feature disposed on and in contact with a top surface of the upper portion of the second conductive feature. The fourth conductive feature is disposed on and in contact with a first portion of the third conductive feature.

A further embodiment is a method. The method includes forming a source/drain region over a substrate, forming a first conductive feature electrically connected to the source/drain region, flipping over the substrate, forming a second conductive feature electrically connected to the source/drain region, depositing a dielectric layer over the second conductive feature, forming an opening in the dielectric layer to expose at least a portion of the second conductive feature, depositing a blocking layer on the exposed portion of the second conductive feature, depositing a barrier layer on the dielectric layer, removing the blocking layer, and depositing a third conductive feature on the barrier layer. The third conductive feature is in contact with the second conductive feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method, comprising:
forming a source/drain region over a substrate;
forming a first conductive feature electrically connected to the source/drain region;
flipping over the substrate;
depositing a hard mask layer on a dielectric layer;
forming a second conductive feature in the dielectric layer and the hard mask layer, wherein the second conductive feature is electrically connected to the source/drain region;
forming an opening in the dielectric layer to expose at least a portion of the second conductive feature;
depositing a blocking layer on the exposed portion of the second conductive feature;
depositing a barrier layer on the dielectric layer;
removing the blocking layer; and
depositing a third conductive feature on the barrier layer, wherein the third conductive feature is in contact with the second conductive feature.

2. The method of claim 1, wherein the barrier layer is formed on the hard mask layer.

3. The method of claim 2, further comprising forming a fourth conductive feature in contact with the second conductive feature and the third conductive feature.

4. The method of claim 3, wherein the blocking layer is deposited on side surfaces and top surface of the second conductive feature.

5. The method of claim 4, wherein the third conductive feature is in contact with the side surfaces of the second conductive feature.

6. A method, comprising:
forming a source/drain region over a substrate;
flipping over the substrate;
depositing a hard mask layer on the substrate;
forming a first conductive feature in the hard mask layer and the substrate, wherein the first conductive feature is electrically connected to the source/drain region;
forming an opening in the hard mask layer to expose an upper portion of the first conductive feature, wherein the upper portion comprises a top surface and side surfaces;
depositing a blocking layer on the exposed upper portion of the first conductive feature;
depositing a barrier layer on the hard mask layer;
removing the blocking layer to expose the upper portion of the first conductive feature; and
depositing a second conductive feature in the opening, wherein the second conductive feature is in contact with the side surfaces of the upper portion of the first conductive feature.

7. The method of claim 6, wherein the barrier layer is deposited on a top surface and side surfaces of the hard mask layer.

8. The method of claim 7, further comprising performing a planarization process to remove a portion of the second conductive feature and a portion of the barrier layer deposited on the top surface of the hard mask layer.

9. The method of claim 8, wherein a top surface of the second conductive feature is coplanar with the top surface of the upper portion of the first conductive feature.

10. The method of claim 6, wherein the barrier layer is deposited on the substrate, and the second conductive feature is deposited on the barrier layer.

11. The method of claim 6, wherein the first and second conductive features include a same material.

12. The method of claim 6, wherein the first and second conductive features include different materials.

13. The method of claim 6, wherein the blocking layer comprises one or more self-assembled monolayers.

14. The method of claim 13, wherein the one or more self-assembled monolayers comprise an azole group-containing compound or a compound terminated with an alkyne group.

15. A method, comprising:
forming a source/drain region over a substrate;
flipping over the substrate;
depositing a hard mask over an isolation region;
forming a first conductive feature in the hard mask layer, wherein the first conductive feature is electrically connected to the source/drain region;
forming an opening to expose an upper portion of the first conductive feature;
depositing a first blocking layer on the exposed upper portion of the first conductive feature;
depositing a first barrier layer on the hard mask layer and the isolation region;
removing the first blocking layer;
depositing a second conductive feature in the opening;

forming a dielectric layer on the hard mask layer; and
depositing a third conductive feature on the first and second conductive features.

16. The method of claim 15, further comprising depositing a second blocking layer on the first and second conductive features.

17. The method of claim 16, further comprising depositing a second barrier layer on the dielectric layer and removing the second blocking layer.

18. The method of claim 17, wherein the third conductive feature is in contact with the second barrier layer.

19. The method of claim 1, wherein the exposed portion of the second conductive feature comprises a top surface and side surfaces.

20. The method of claim 15, wherein the upper portion of the first conductive feature comprises a top surface and side surfaces.

\* \* \* \* \*